US012610794B2

(12) United States Patent
Kim et al.

(10) Patent No.: US 12,610,794 B2
(45) Date of Patent: Apr. 21, 2026

(54) SEMICONDUCTOR DEVICE AND METHOD HAVING DEEP TRENCH ISOLATION

(71) Applicant: SK keyfoundry Inc., Cheongju-si (KR)

(72) Inventors: Kwang Il Kim, Cheongju-si (KR); Yang Beom Kang, Cheongju-si (KR); Sang Min Han, Cheongju-si (KR); Seong Hyun Kim, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 442 days.

(21) Appl. No.: 18/175,840

(22) Filed: Feb. 28, 2023

(65) Prior Publication Data

US 2024/0112948 A1 Apr. 4, 2024

(30) Foreign Application Priority Data

Sep. 30, 2022 (KR) ........................ 10-2022-0125107

(51) Int. Cl.
| | |
|---|---|
| *H10W 10/00* | (2026.01) |
| *H10D 84/83* | (2025.01) |
| *H10W 10/17* | (2026.01) |

(52) U.S. Cl.
CPC .......... *H10W 10/014* (2026.01); *H10D 84/83* (2025.01); *H10W 10/17* (2026.01)

(58) Field of Classification Search
CPC .............. H01L 21/79224; H01L 21/76; H01L 21/7602; H01L 21/76229; H01L 21/76235; H01L 21/76232; H10D 84/83
See application file for complete search history.

(56) References Cited

U.S. PATENT DOCUMENTS

| | | | |
|---|---|---|---|
| 10,699,960 | B2 | 6/2020 | Su et al. |
| 11,069,559 | B1 * | 7/2021 | Chen ................. H01L 21/31056 |
| 2019/0035799 | A1 * | 1/2019 | Shu ......................... H10B 43/40 |
| 2020/0105612 | A1 * | 4/2020 | Lin .................... H10D 84/0193 |

(Continued)

FOREIGN PATENT DOCUMENTS

KR 10-2020-0125873 A 11/2020

OTHER PUBLICATIONS

Korean Office Action issued on Aug. 28, 2025, in corresponding Korean Patent Application No. 10-2022-0125107. (9 pages in English, 8 pages in Korean).

*Primary Examiner* — Jessica S Manno
*Assistant Examiner* — Andrew Chung
(74) *Attorney, Agent, or Firm* — NSIP Law

(57) ABSTRACT

A manufacturing method for a semiconductor device, includes: forming a first gate structure and a second gate structure on a substrate; forming a deep trench isolation (DTI) hard mask on the first and second gate structures; forming a deep trench isolation disposed between the first gate structure and the second gate structure; depositing a first undoped oxide layer in the deep trench isolation; performing a first etch-back process on the first undoped oxide layer to remove a portion of the undoped oxide layer; depositing a first deep trench isolation (DTI) gap-fill layer on a remaining portion of the undoped oxide layer, and performing a second etch-back process on the first DTI gap-fill layer; depositing a second DTI gap-fill layer to seal the deep trench isolation, and forming a planarized second DTI gap-fill layer by a planarization process; and depositing a second undoped layer on the planarized second DTI gap-fill layer.

18 Claims, 13 Drawing Sheets

(56) References Cited

U.S. PATENT DOCUMENTS

2020/0343145 A1* 10/2020 Kang ................. H10D 30/0227
2021/0066134 A1   3/2021 Kang et al.
2022/0270932 A1   8/2022 Kang et al.
2023/0207394 A1   6/2023 Kang et al.

* cited by examiner

SEMICONDUCTOR DEVICE AND METHOD HAVING DEEP TRENCH ISOLATION

CROSS-REFERENCE TO RELATED APPLICATION

This application claims the benefit under 35 USC § 119 of Korean Patent Application No. 10-2022-0125107 filed on Sep. 30, 2022, in the Korean Intellectual Property Office, the entire disclosure of which is incorporated herein by reference for all purposes.

BACKGROUND

1. Field

The present disclosure relates to a manufacturing method for a non-volatile memory semiconductor device having deep trench isolation (DTI).

2. Description of Related Art

A semiconductor device, including a non-volatile memory device and a logic device together in one chip, may be desired to store or erase data. However, there may be a difference in height between the non-volatile memory device and the logic device. Due to the different height levels, pattern defects may occur in the photo process.

To solve such a problem, it may be desired to planarize an interlayer insulating layer formed on the non-volatile memory device and the logic device. However, Junction isolation or deep trench isolation (DTI) may be desired for electrical isolation between the non-volatile memory device and the logic device. If the DTI is applied due to such reason, the overall chip size may reduce. Still, a very complicated manufacturing method may be desired since the planarization process and the process of filling the deep trench isolation with an insulating layer are involved, and a significant manufacturing cost may be incurred.

SUMMARY

This Summary is provided to introduce a selection of concepts in a simplified form that are further described below in the Detailed Description. This Summary is neither intended to identify key features or essential features of the claimed subject matter, nor is it intended to be implemented as an aid in determining the scope of the claimed subject matter.

In one general aspect, a manufacturing method for a semiconductor device, includes: forming a first gate structure and a second gate structure in a first region and a second region, respectively, on a substrate; forming a deep trench isolation (DTI) hard mask on the first and second gate structures; forming a deep trench isolation disposed between the first gate structure and the second gate structure using the DTI hard mask; depositing a first undoped oxide layer in the deep trench isolation; performing a first etch-back process on the first undoped oxide layer to remove a portion of the undoped oxide layer; depositing a first deep trench isolation (DTI) gap-fill layer on a remaining portion of the undoped oxide layer, and performing a second etch-back process on the first DTI gap-fill layer; depositing a second DTI gap-fill layer to seal the deep trench isolation, and forming a planarized second DTI gap-fill layer by a planarization process; and depositing a second undoped layer on the planarized second DTI gap-fill layer.

The first DTI gap-fill layer may have a same material as the second DTI gap-fill layer.

An uppermost surface of the second DTI gap-fill layer and an uppermost surface of the DTI hard mask may be coplanar with each other after the planarization process.

The second undoped layer may be in contact with the second DTI gap-fill layer and the DTI hard mask.

The first DTI gap-fill layer may include a void.

The manufacturing method may further include forming a first contact plug and a second contact plug in the first region and the second region, respectively; and forming a first metal wiring and a second metal wiring connected to the first contact plug and the second contact plug, respectively. The first contact plug may be formed passing through the second undoped layer and the DTI hard mask, and the second contact plug may be formed passing through the second undoped layer, the DTI hard mask and the second DTI gap-fill layer.

A height of the first gate structure may be greater than a height of the second gate structure, and the deep trench isolation may be formed passing through a shallow trench isolation.

The second DTI gap-fill layer may overlap the second gate structure but does not overlap the first gate structure, and the first DTI gap-fill layer and the second DTI gap-fill layer may be formed of a BPSG-based oxide layer.

The DTI hard mask may include a first hard mask insulating layer and a second hard mask insulating layer. A Boron Phosphorus Silicate Glass (BPSG)-based oxide layer may be implemented for the first hard mask insulating layer, and a Tetra Ethyl Ortho Silicate (TEOS)-based oxide layer may be implemented for the second hard mask insulating layer.

In another general aspect, a manufacturing method for a semiconductor device, includes forming a shallow trench isolation and a plurality of gate structures on a substrate; depositing a deep trench isolation (DTI) hard mask on the plurality of gate structures; forming a deep trench isolation in the substrate, using the DTI hard mask, passing through the shallow trench isolation; forming a first undoped layer in the deep trench isolation; forming a first DTI gap-fill layer on the first undoped layer; depositing a second DTI gap-fill layer on the first DTI gap-fill layer to seal the deep trench isolation; performing a planarization process to the second DTI gap-fill layer and the DTI hard mask to form a planarized second DTI gap-fill layer and a planarized DTI hard mask, such that the planarized second DTI gap-fill layer is coplanar with the planarized DTI hard mask; and depositing a second undoped layer on the planarized second DTI gap-fill layer and the planarized DTI hard mask.

The forming of the first undoped layer inside the deep trench isolation includes depositing and performing a first etch-back process on the first undoped layer. The forming of the first DTI gap-fill layer on the first undoped layer may include depositing and performing a second etch-back process on the first DTI gap-fill layer.

The manufacturing method may further include forming a first contact plug and a second contact plug. The first contact plug may be formed passing through the DTI hard mask and the second undoped layer. The second contact plug may be formed passing through the DTI hard mask the second DTI gap-fill layer, and the second undoped layer.

In another general aspect, a semiconductor device, includes a first gate structure and a second gate structure formed on a substrate; a deep trench isolation disposed in the substrate between the first gate structure and the second gate structure; a first undoped oxide layer disposed in the deep trench isolation; a first deep trench isolation (DTI) gap-fill layer disposed on a portion of the undoped oxide layer; a deep trench isolation (DTI) hard mask disposed on the first and second gate structures; a planarized second DTI gap-fill layer disposed on the deep trench isolation to seal the deep trench isolation; and a second undoped layer disposed on the planarized second DTI gap-fill layer and a portion of the DTI hard mask.

The first DTI gap-fill layer may have a same material as the second DTI gap-fill layer.

An uppermost surface of the second DTI gap-fill layer and an uppermost surface of the DTI hard mask may be coplanar.

The first DTI gap-fill layer may include a void.

The semiconductor device may further include a first contact plug and a second contact plug disposed in different regions of the substrate; and a first metal wiring and a second metal wiring connected to the first contact plug and the second contact plug, respectively. The first contact plug may be formed passing through the second undoped layer and the DTI hard mask, and the second contact plug may be formed passing through the second undoped layer, the DTI hard mask and the second DTI gap-fill layer.

A height of the first gate structure may be greater than a height of the second gate structure, and the deep trench isolation may be formed passing through a shallow trench isolation.

The second DTI gap-fill layer may overlap the second gate structure but does not overlap the first gate structure, and the first DTI gap-fill layer and the second DTI gap-fill layer may be formed of a BPSG-based oxide layer.

The DTI hard mask may include a Boron Phosphorus Silicate Glass (BPSG)-based oxide layer and a Tetra Ethyl Ortho Silicate (TEOS)-based oxide layer.

Other features and aspects will be apparent from the following detailed description, the drawings, and the claims.

BRIEF DESCRIPTION OF THE DRAWINGS

Throughout the drawings and the detailed description, the same reference numerals refer to the same or like elements. The drawings may not be to scale, and the relative size, proportions, and depiction of elements in the drawings may be exaggerated for clarity, illustration, and convenience.

DETAILED DESCRIPTION

Figure 1:
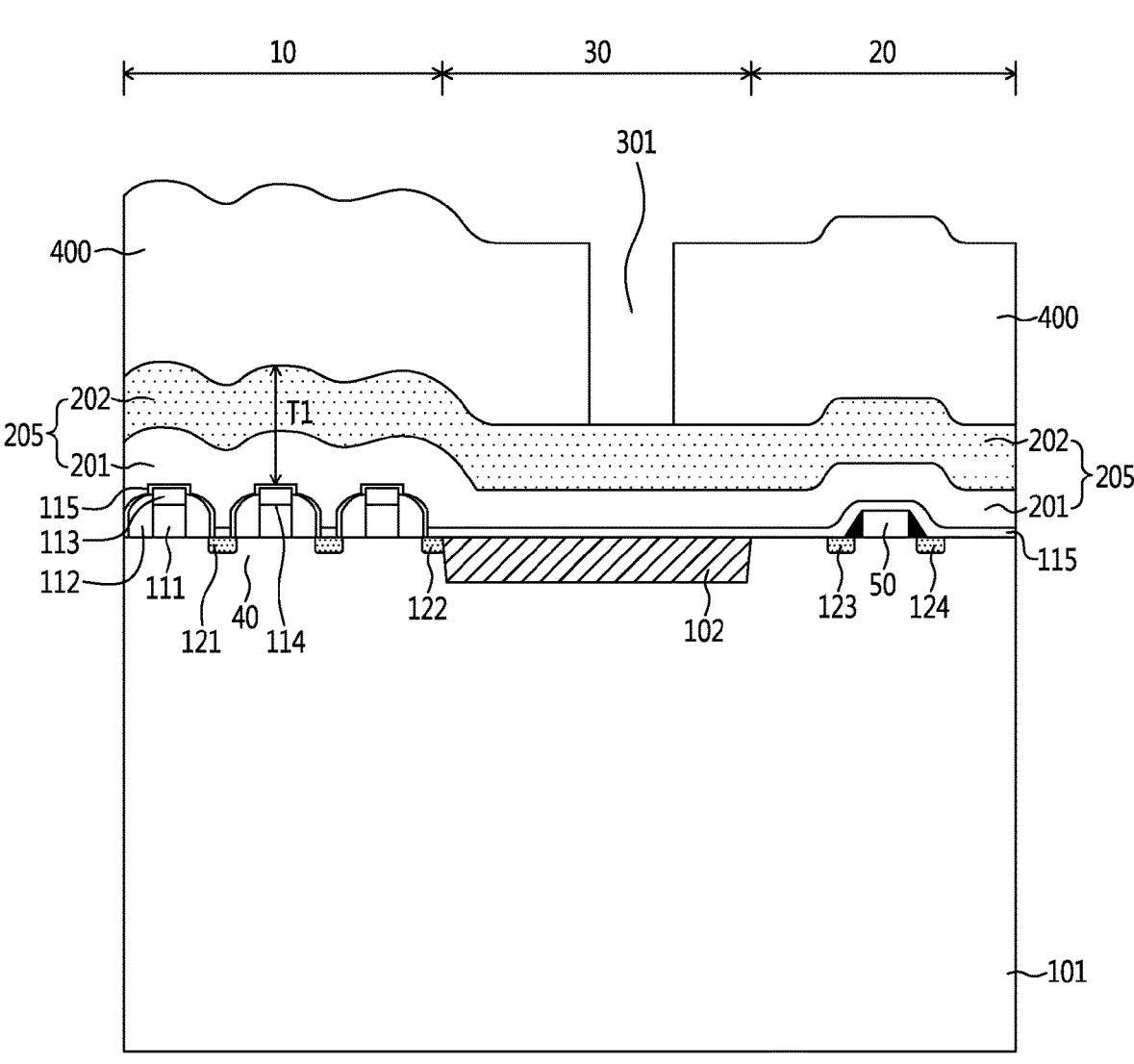
FIGS. 1 to 13 illustrate sectional views explaining of an example manufacturing method for a semiconductor device in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As implemented herein, the term "and/or" includes any one and any combination of any two or more of the associated listed items.

Although terms such as "first," "second," and "third" may be implemented herein to describe various members, components, regions, layers, or sections, these members, components, regions, layers, or sections are not to be limited by these terms. Rather, these terms are only implemented to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be implemented herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms implemented herein are to be interpreted accordingly.

The terminology implemented herein is for describing various examples only, and is not to be implemented to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The terms indicating a part such as "part" or portion" implemented herein to mean that the component may represent a device that may include a specific function, a software that may include a specific function, or a combination of device and software that may include a specific function, but it is not necessarily limited to the function expressed. This is only provided to help a more general understanding of one or more examples herein, Various modifications and variations are possible from these descriptions by those of ordinary skill in the art to which the one or more examples pertains.

In addition, it should be noted that all electrical signals implemented herein are examples, and when an inverter or the like is additionally provided in the circuit in accordance with one or more embodiments, the signs of all electrical signals to be described below may be reversed. Accordingly, the scope of the embodiments is not limited to the direction of the signal.

The one or more examples may solve problems related to the previously mentioned issues and provide a manufacturing method for a semiconductor device where a deep trench structure formed between a non-volatile memory device and a logic device is effectively filled with an insulating layer.

The features of the examples described herein may be combined in various ways as will be apparent after an understanding of the disclosure of this application. Further, although the examples described herein have a variety of configurations, other configurations are possible as will be apparent after an understanding of the disclosure of this application.

A targeted problem of the disclosure is not limited by the problems mentioned above. A person skilled in the relevant field of technology may understand other problems from the following description.

A detailed description is given below, with attached drawings.

The features of the examples described herein may be combined in various ways, as will be apparent after an understanding of the disclosure of this application. Further, although the examples described herein have a variety of configurations, other configurations are possible, as will be apparent after an understanding of the disclosure of this application.

FIGS. 1 to 13 illustrate a sectional view explaining the examples of a manufacturing method for a semiconductor device in accordance with one or more embodiments.

Referring to FIG. 1, a semiconductor device may include a first region 10 having a first gate structure 40 on a substrate 101, a second region 20 having a second gate structure 50 on the substrate 101, and an isolation region 30 between the first region 10 and the second region 20. The first gate structure 40 may belong to the non-volatile memory device, and the second gate structure 50 may belong to a logic device. Therefore, the second gate structure 50 may be called a logic gate 50. In another example, the second gate structure 50 may belong to a digital or analog and mixed-signal device.

In the semiconductor device, the first gate structure 40 may include a floating gate 111, a control gate 112, and a gate hard mask 113 for gate etching. The floating gate 111 and the control gate 112 are formed of conductive materials, such as poly-silicon material. The gate hard mask 113 for gate etching may be formed of, for example, a silicon oxide layer, a silicon nitride layer, etc. The first gate structure 40 may have a height greater than the height of the second gate structure 50, because the sum of the heights of the floating gate 111 and the gate hard mask 113 is greater than the height of the logic gate 50.

The floating gate 111 is surrounded by the control gate 112 in the first gate structure 40. In another example, the floating gate 111 may be located under the control gate 112. The gate hard mask 113 for gate etching may be formed on the floating gate 111. The gate hard mask 113 for gate etching protects the floating gate 111 from being damaged by another etching process.

The control gate 112 surrounds the floating gate 111. The control gate 112 may have a height different from the floating gate 111. In some examples, the control gate 112 may be formed to be higher than the floating gate 111.

An oxide-nitride-oxide (ONO) dielectric layer 114 may be formed between the floating gate 111 and the control gate 112. The ONO dielectric layer 114 has a structure where a first insulating layer that is an oxide layer, a second insulating layer that is a nitride layer, and a third insulating layer that is an oxide layer are deposited in order, that is, an oxide-nitride-oxide (ONO) structure. The first insulating layer and the third insulating layer, which are oxide layers, may be deposited using a thermal oxidation process or a low pressure chemical vapor deposition (LPCVD) process using Tetra Ethyl Ortho Silicate (TEOS). In addition, the second insulating layer, a nitride layer, may be deposited using the LPCVD process.

The first region 10 may further include a highly doped source or drain region 121, 122 in the substrate 101.

The second region 20 includes a highly doped source region 123, a highly doped drain region 124, and the second gate structure 50. The gate insulating layer (not shown) may be formed under the second gate structure 50. The height of the second gate structure 50 is less than the height of the first gate structure 40. Therefore, the second region 20 has a height lower than the height of the first region 10 with respect to the top surface of the substrate 101.

The isolation region 30 may electrically isolate the first region 10 from the second region 20. In the isolation region 30, a shallow trench isolation 102 and a deep trench isolation 305 (see FIG. 5, etc.) may be formed. The deep trench isolation 305, which will be described later, may be formed (while passing) through the shallow trench isolation 102.

An etch stop layer (ESL) 115 may be formed on the first gate structure 40 and the second gate structure 50. The etch stop layer 115 may be formed on the floating gate 111 and the control gate 112. The etch stop layer 115 may be continuously formed in the first region 10, the second region 20, and the isolation region 30. In the examples, the etch stop layer 115 may be formed using SiN, SiO2, SiCN, SiOC, or SiON with 20-100 nm in thickness.

A deep trench isolation (DTI) hard mask 205, comprising a first hard mask insulating layer 201 and a second hard mask insulating layer 202, may be formed on the etch stop layer 115. Thus, the etch stop layer 115, the first hard mask insulating layer 201, and the second hard mask insulating layer 202 may be sequentially formed on the first gate structure 40 and the second gate structure 50. The first hard mask insulating layer 201 and the second hard mask insulating layer 202 serve as a hard mask when forming a deep trench isolation in the isolation region 30. Therefore, the first hard mask insulating layer 201 and the second hard mask insulating layer 202 may be collectively referred to as a DTI hard mask 205 for deep trench etching. The DTI hard mask 205 for deep trench etching may have a first thickness T1.

The first hard mask insulating layer 201 may be deposited with a predetermined thickness to cover the floating gate 111 and the control gate 112. An interface between the first hard mask insulating layer 201 and the second hard mask insulating layer 202 may be formed to be curved.

In one or more examples, both the first hard mask insulating layer 210 and the second hard mask insulating layer 202 may be formed of an oxide layer. For the first hard mask insulating layer 202, an oxide layer of a Boron Phosphorus Silicate Glass (BPSG) film may be implemented. The first hard mask insulating layer 201 may have a thickness of 300-700 nm. The BSPG film may belong to the doped oxide layer.

For the second hard mask insulating layer 202, an oxide layer of a Tetra Ethyl Ortho Silicate (TEOS) film may be implemented. The TEOS film may belong to the undoped oxide layer. Therefore, DTI hard mask 205 may comprise both undoped and doped oxide layers.

The second hard mask insulating layer 202 may have a thickness of 700-1000 nm greater than the thickness of the first hard mask insulating layer 201. The second hard mask insulating layer 202 is a TEOS-based oxide layer, and the first hard mask insulating layer 201 is a BPSG-based oxide layer. The selection of oxide films may depend on subsequent processes, such as etch-back or CMP processes.

Referring to FIG. 1, a first mask pattern 400 may be formed by applying a patterned photoresist, except for a region where a deep trench isolation is to be formed. In the first mask pattern 400, a first opening 301 may be formed to form a deep trench isolation in the substrate. The first mask pattern 400 may be formed at a predetermined thickness on the DTI hard mask 205. The first opening 301 may partially overlap the shallow trench isolation 102 because a deep trench is formed by penetrating the shallow trench isolation 102.

Figure 2:
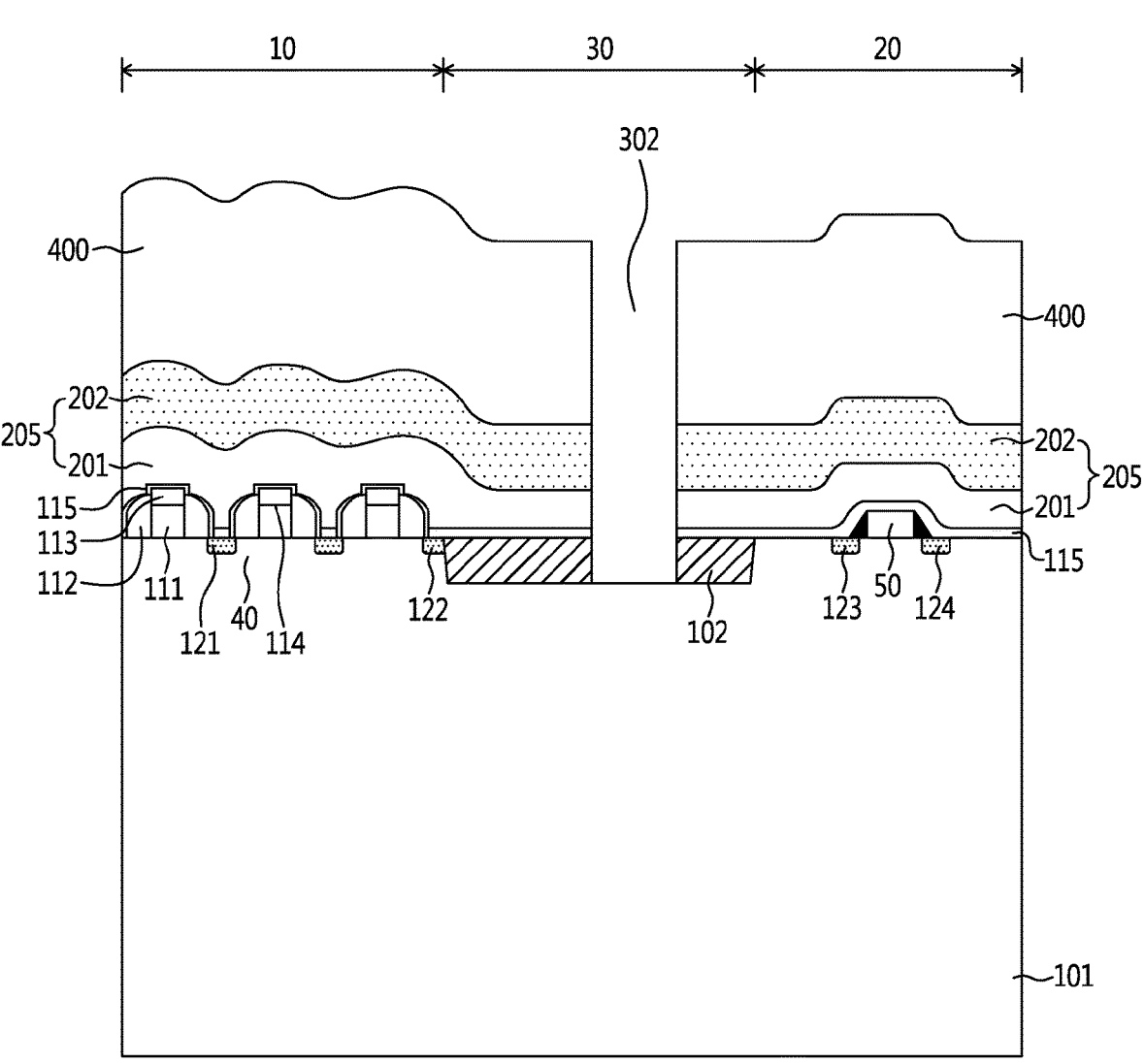

Referring to FIG. 2, a first etching process is performed using the first mask pattern 400. The first etching process may form a second opening 302. The DTI hard mask 205, the etch stop layer 115, and the shallow trench isolation 102 are etched in order. The first etching process may expose a portion of the substrate 101 below the shallow trench isolation 102. The first mask pattern 400 is removed after the first etching process implemented by a plasma ashing process.

Figure 3:
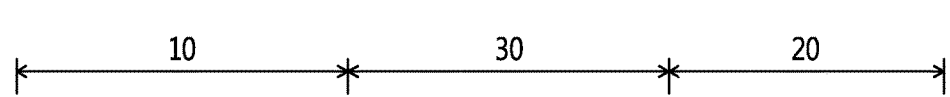
Figure 3:
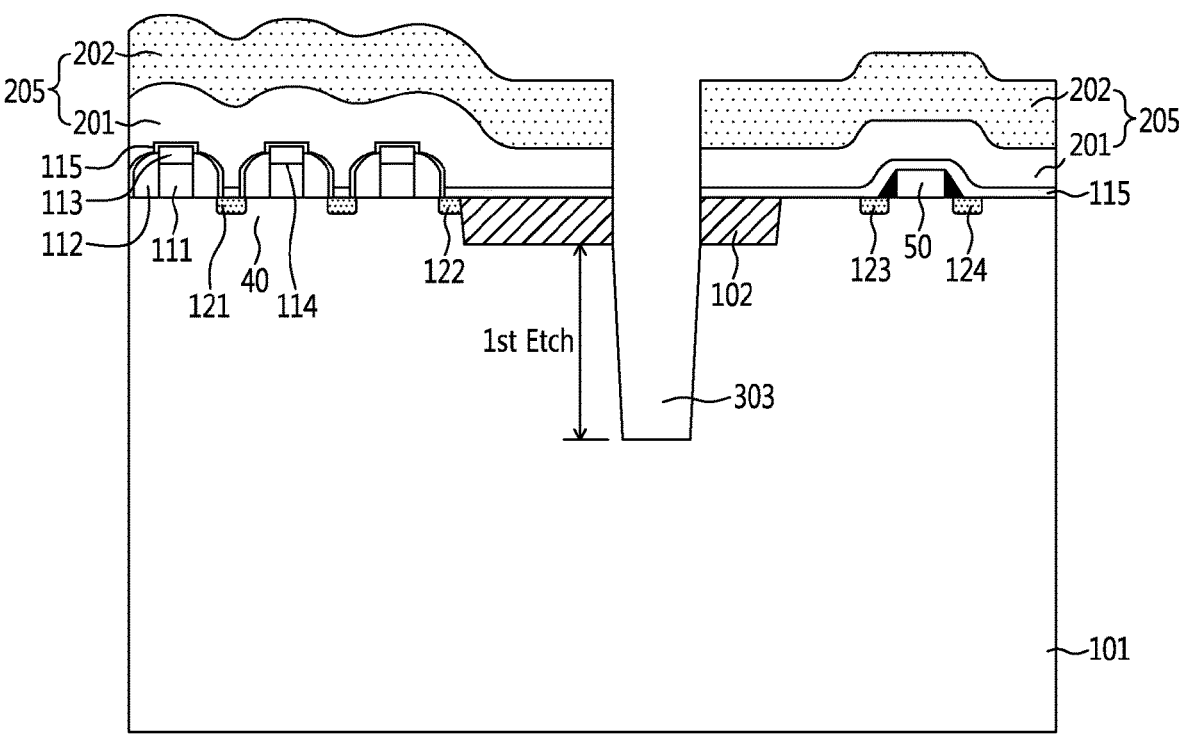

Referring to FIG. 3, a first dry etching is performed using the DTI hard mask 205 as a mask (1$^{st}$ Etch). The first dry trench etching may form a first deep trench 303. The first deep trench 303 has a depth of 4,000-6,000 nm. As the depth increases, the width of the trench may become narrower. A sidewall of the first deep trench 303 may be inclined other than at right angles. During the first dry etching, portions of the DTI hard mask 205 may be lost. After the first dry etching, the thickness of the DTI hard mask 205 may decrease.

Figure 4:
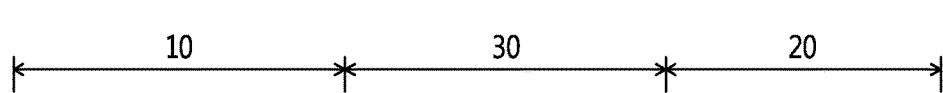
Figure 4:
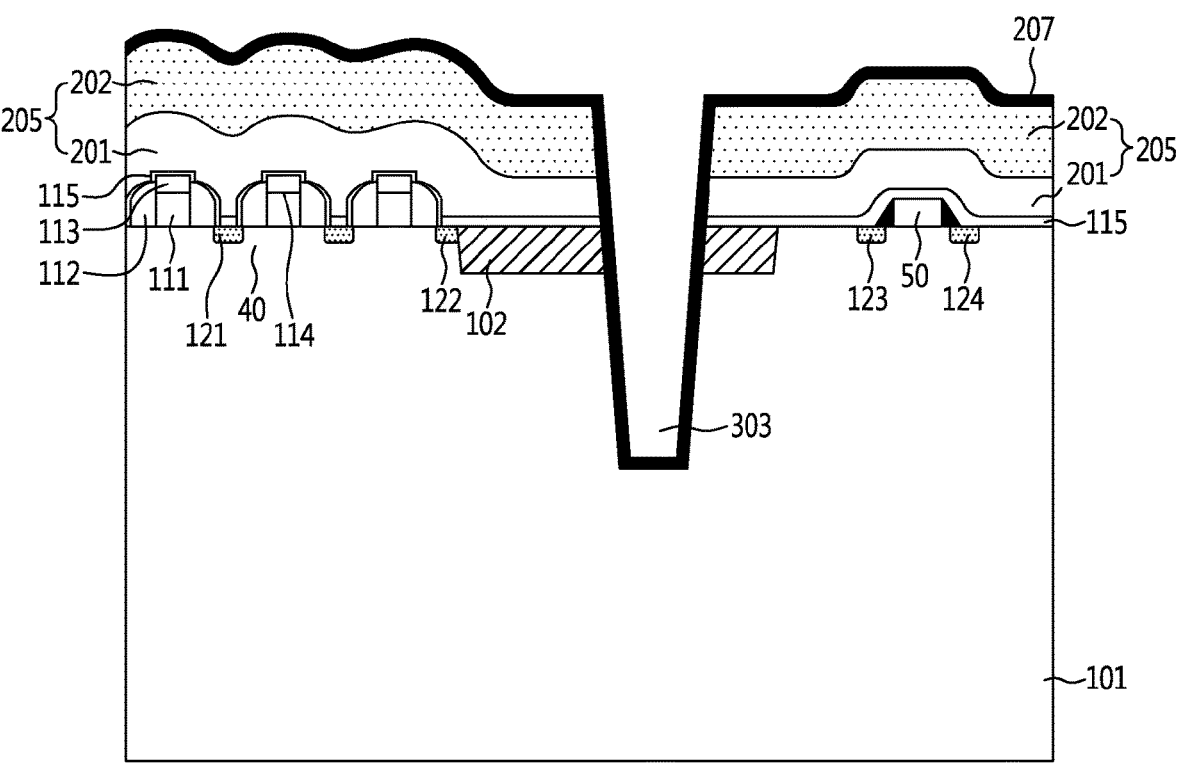

Referring to FIG. 4, a first sidewall insulating layer 207 may be deposited along the first deep trench 303 as well as on the DTI hard mask 205. The reason for depositing the first sidewall insulating layer 207 may be to protect the sidewall of the first deep trench 303 from a subsequent etching process, for example, a second dry etching. The first sidewall insulating layer 207 may be formed by depositing an undoped oxide layer, for example, a TEOS film, by a CVD method. In one or more examples, the thickness of the first sidewall insulating layer 207 ranges from 100 to 305 nm.

Figure 5:
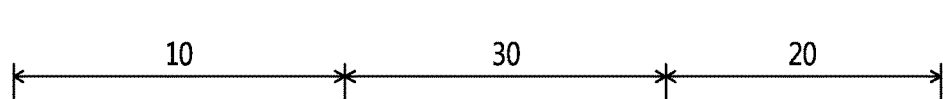
Figure 5:
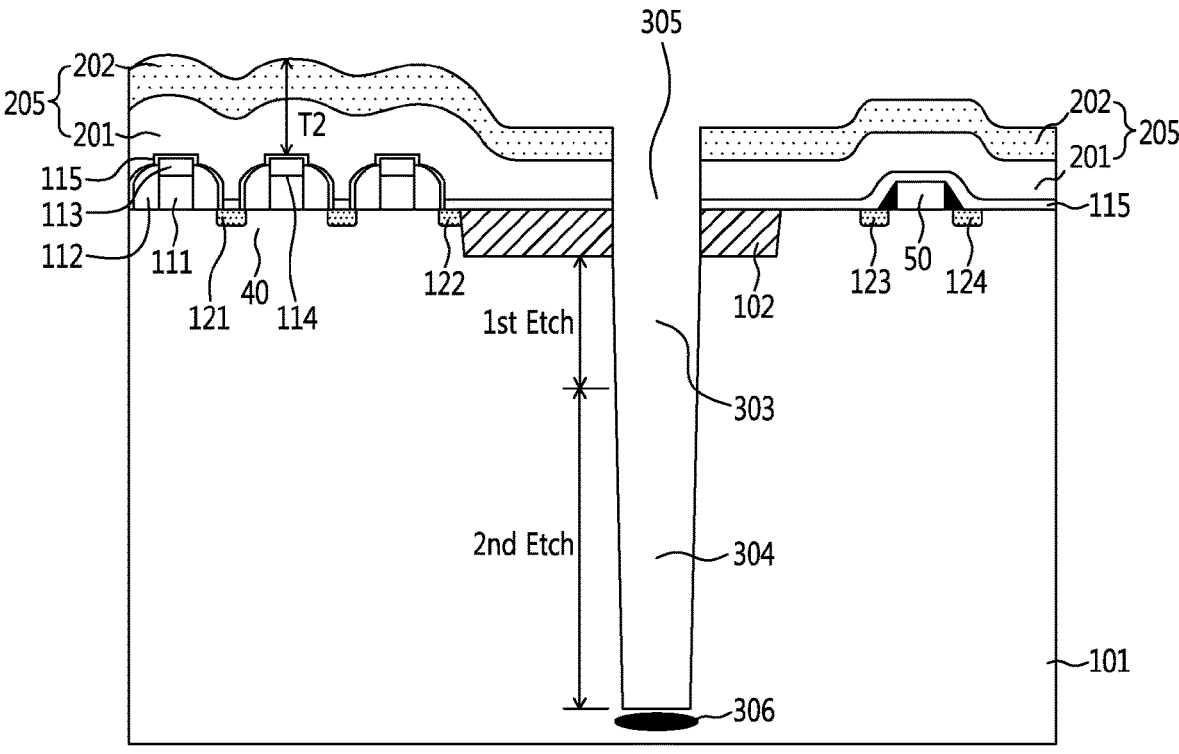

Referring to FIG. 5, a second dry etching (2$^{nd}$ Etch) is performed using the first sidewall insulating layer 207 and the DTI hard mask 205 as an etch mask.

A second deep trench 304 may be formed under the first deep trench 303 by the second dry etching (2$^{nd}$ Etch). The first sidewall insulating layer 207 may be almost removed during the second dry etching (2$^{nd}$ Etch). The deep trench isolation 305 having a desired depth may be formed in the substrate 101 by the first and second dry etchings. For example, the deep trench isolation 305 may have a depth of 10,000-20,000 nm.

The DTI hard mask 205 may be partially removed by the second dry etching (2$^{nd}$ Etch). The DTI hard mask 205 may become thinner from the first thickness T1 to a second thickness T2. The second deep trench 304 may have narrower width with increasing depth. The width of the second deep trench 304 may be less than the width of the first deep trench 303.

After performing the second dry etching, a channel stop implantation is performed to form a channel stop region 306 under the bottom surface of the deep trench isolation 305.

Figure 6:
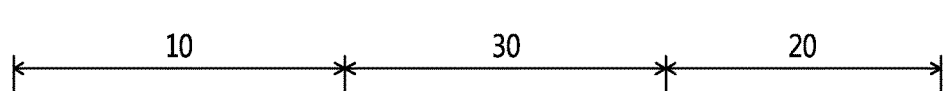
Figure 6:
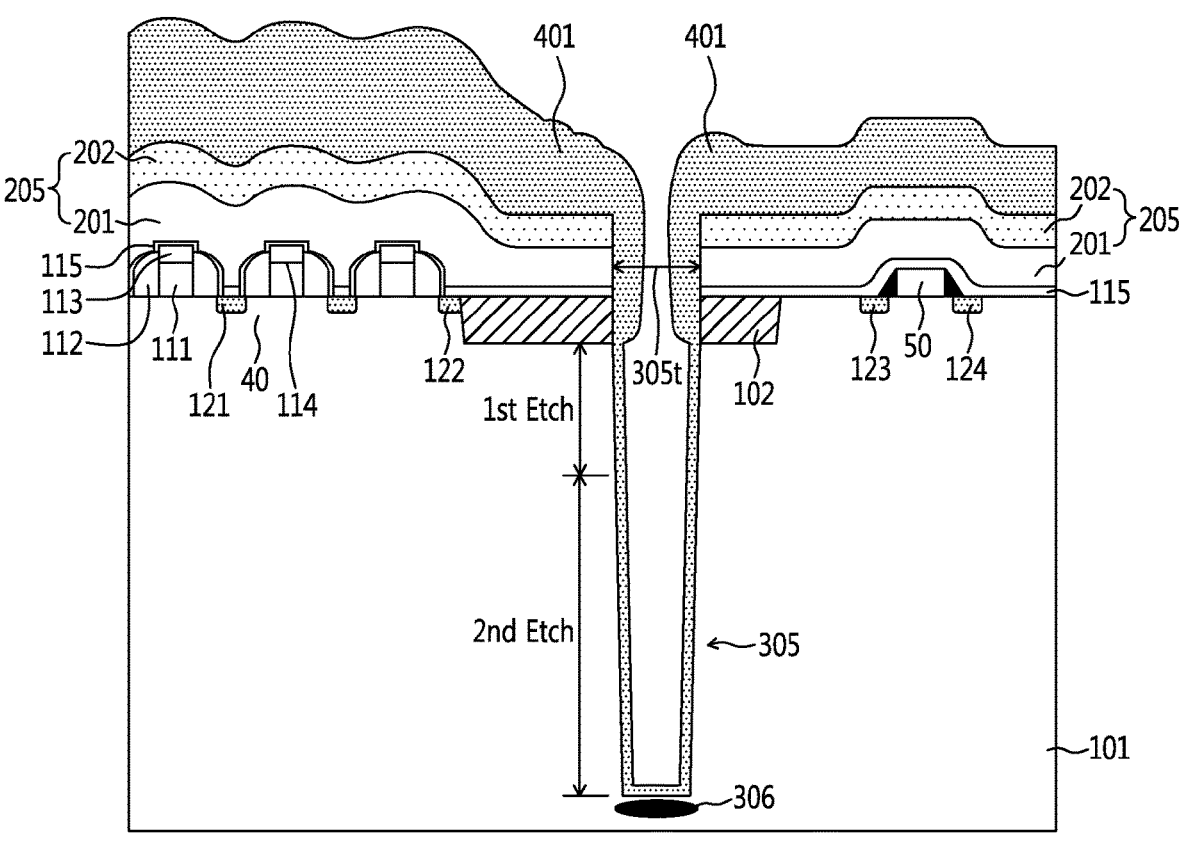

Referring to FIG. 6, a first gap-fill process may be performed on the deep trench isolation 305. First, a first undoped oxide layer 401, for example, a TEOS film, may be deposited on the DTI hard mask 205 as well as on the sidewall and bottom surface of the deep trench isolation 305. The first undoped oxide layer 401 may block boron (B) or phosphorus (P) atoms in the BPSG film from penetrating into the substrate. The first undoped oxide layer 401 may have a thickness ranging from 800 to 3000 nm.

The first undoped oxide layer 401 may be deposited using a Plasma Enhanced Chemical Vapor Deposition (PECVD) or an LPCVD method. The first undoped oxide layer 401 has a non-conformal step coverage, so a gap 305*t* between two top corners of the deep trench isolation 305 becomes narrow. As the gap 305*t* becomes narrow, the deep trench isolation 305 may be easily sealed.

Figure 7:
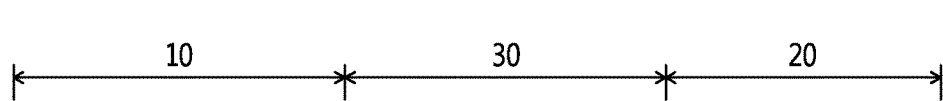
Figure 7:
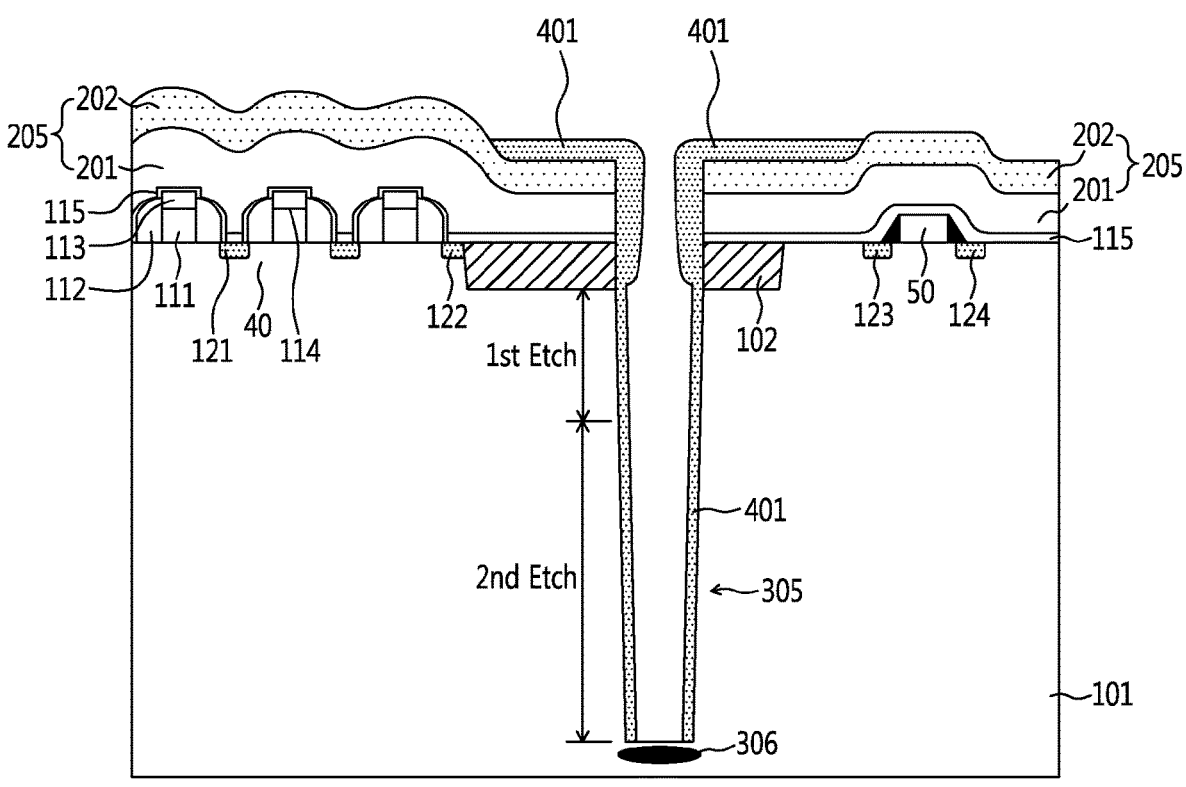

Referring to FIG. 7, a first etch-back process to the first undoped oxide layer 401 is performed to remove the first undoped oxide layer 401 formed on the DTI hard mask 205. Although the first undoped oxide layer 401 on the DTI hard mask 205 may be almost removed after the first etch-back process, the first undoped oxide layer 401 may still remain on the sidewall surface of the deep trench isolation 305 as well as on the top corners of the deep trench isolation 350. An upper portion of the first undoped oxide layer 401 near the top corners of the deep trench isolation 350 may be formed to be thicker than a lower portion of the sidewall insulating layer near the bottom of the deep trench isolation 350.

The first undoped oxide layer 401 may be removed on the bottom surface of the deep trench isolation 305 by the first etch-back process, such that the channel stop region 306 may be exposed again.

A second channel stop ion implantation process may be performed on the channel stop region 306, such that a doping concentration of the channel stop region 306 may be increased. As the concentration of the channel stop region 306 increases, an electrical isolation capability between one device and another adjacent device may be strengthened.

Figure 8:
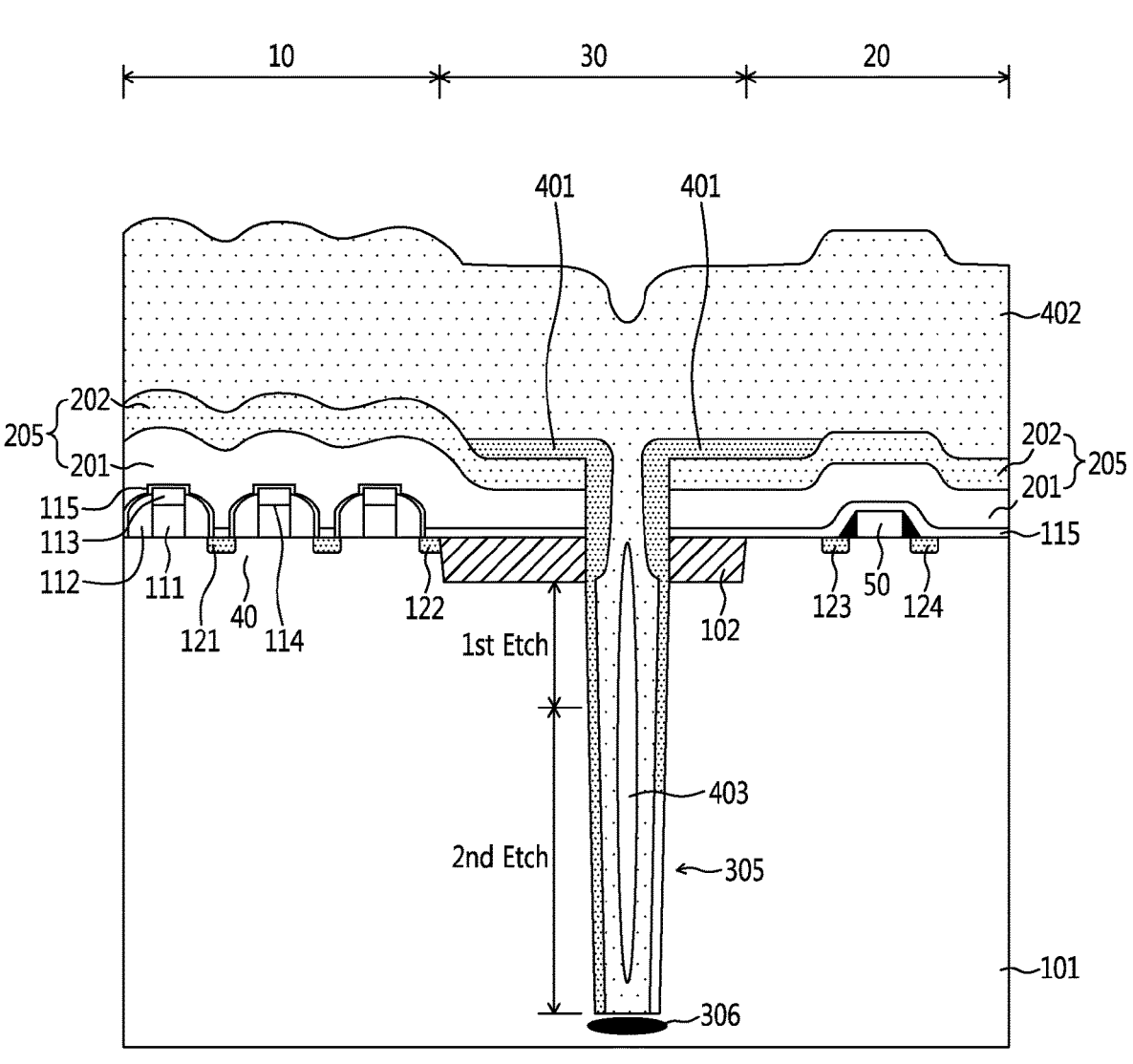

Referring to FIG. 8, a first DTI gap-fill layer 402 may be deposited along the deep trench isolation to fill inside the deep trench isolation 305. The first DTI gap-fill layer 402 is formed on the first undoped oxide layer 401 as well as on the DTI hard mask 205. BPSG film may be implemented for the first DTI gap-fill layer 306 with a thickness range of 1,100-1,500 nm. The BPSG film may have good reflow characteristics, so the BPSG film may be uniformly deposited on the sidewall surface of the deep trench isolation 305.

An air gap or a void 403 may be formed inside the deep trench isolation 305 implemented by the first DTI gap-fill layer 402. The first DTI gap-fill layer 402 surrounds the outside of the air gap or void 403.

Figure 9:
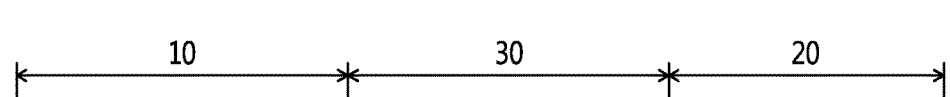
Figure 9:
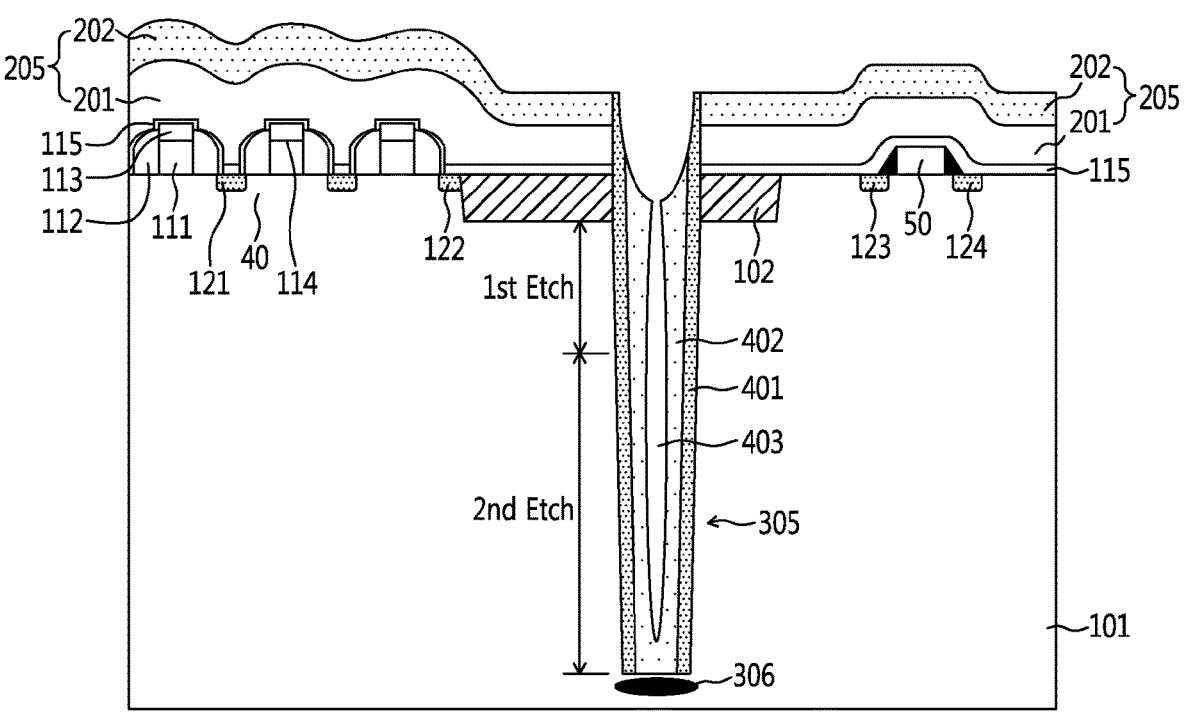

Referring to FIG. 9, a second etch-back process is performed on the first DTI gap-fill layer 402 to remove the first DTI gap-fill layer 402 formed above the DTI hard mask 205. As an optional process, the CMP process may be performed to remove the first DTI gap-fill layer 402. Although the first DTI gap-fill layer 402 on the DTI hard mask 205 is almost removed on the DTI hard mask 205, the first DTI gap-fill layer 402 still remains on the sidewall surface of the deep trench isolation 305. Therefore, both the first undoped oxide layer 401 and the first DTI gap-fill layer 402 may remain on the sidewall surface of the deep trench isolation 305. The air gap 403 may be opened by the second etch-back process.

Figure 10:
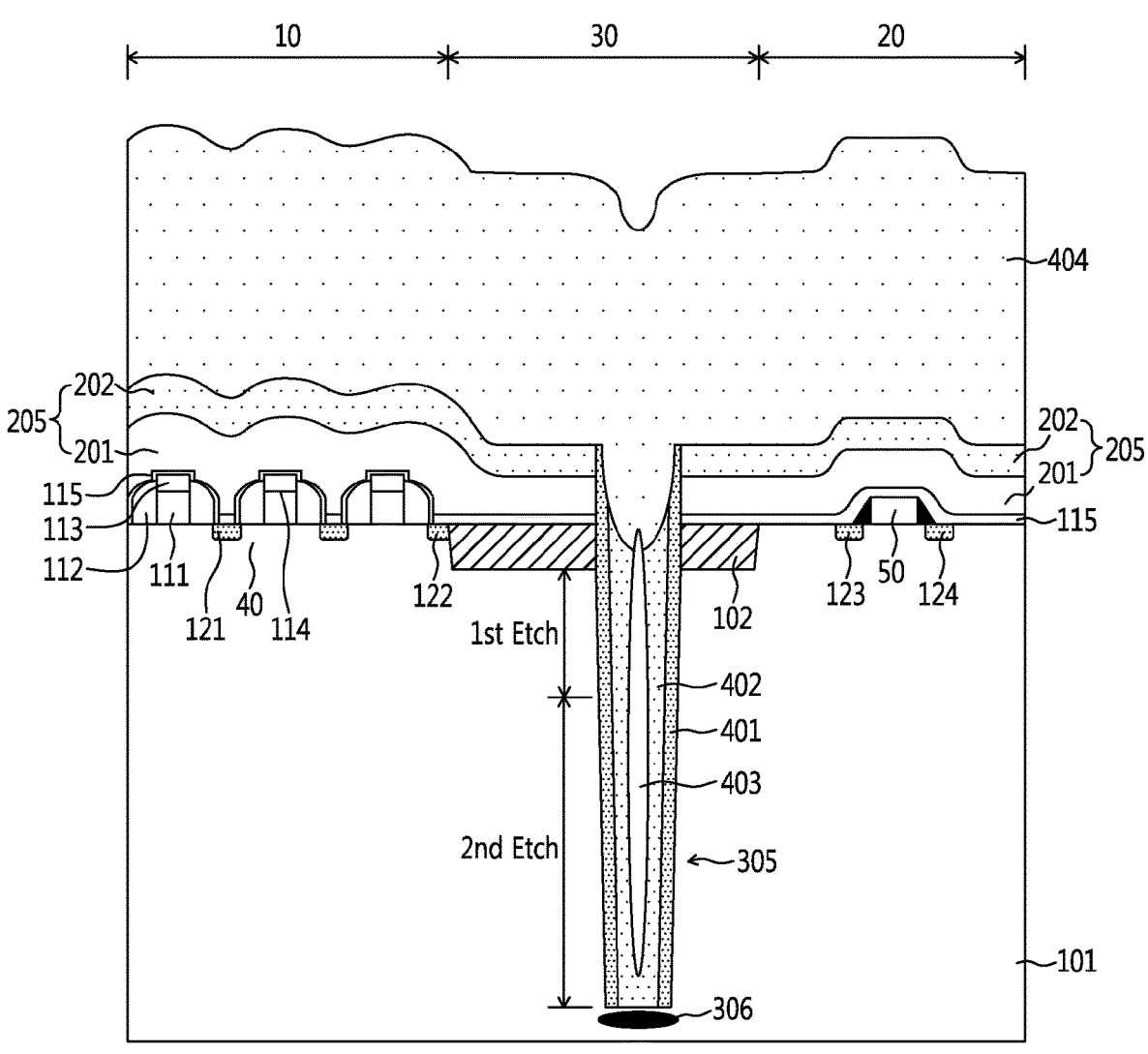

Referring to FIG. 10, in order to completely fill the inside of the deep trench isolation 305, a second DTI gap-fill layer 404 is deposited. For the second DTI gap-fill layer 404, an oxide layer of the same BPSG film as the first DTI gap-fill layer 402 may be implemented. When it is deposited using the same material, the adhesion between the oxide layers is improved such that the peeling of the thin film may be reduced in the chemical mechanical planarization (CMP) process to be performed later. By the deposition process of the second DTI gap-fill layer 404, the deep trench isolation 305 as well as the air gap 403 may be completely sealed.

Figure 11:
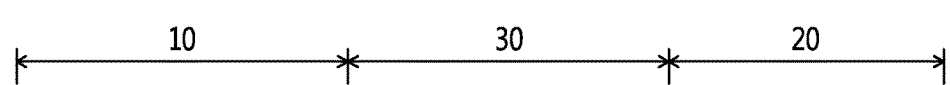
Figure 11:
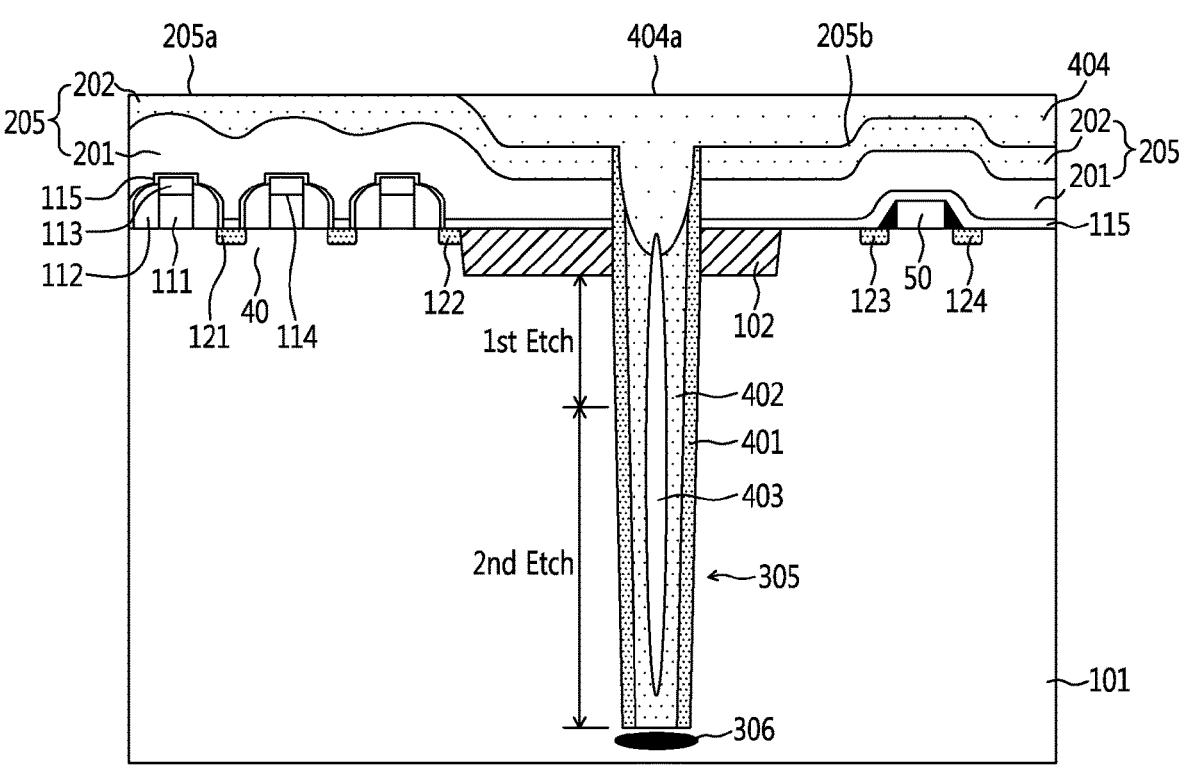

Referring to FIG. 11, the CMP process is performed to planarize the second DTI gap-fill layer 404. The DTI hard mask 205 in the first region 10 may be exposed during the CMP process. Thus, both the DTI hard mask 205 in the first region 10 and the second DTI gap-fill layer 404 may be together planarized by the CMP process, such that a planarized DTI hard mask 205a and a planarized second DTI gap-fill layer 404a are obtained. Thus, the planarized second DTI gap-fill layer 404a is coplanar with the planarized DTI hard mask 205a.

However, the DTI hard mask 205 in the second region 20 may not be exposed during the CMP process, because the planarized second DTI gap-fill layer 404a may still remain over the DTI hard mask 205. As described above, the second gate structure 50 in the second region 20 has a height lower than the height of the first gate structure 40 in the first region 10 with respect to the top surface of the substrate 101. Therefore, a thick BPSG film for the second DTI gap-fill layer 404 is deposited on the second region 20 compared to the first region 10. An unplanarized DTI hard mask 205b is still remained under the planarized second DTI gap-fill layer 404a in the second region 20.

Figure 12:
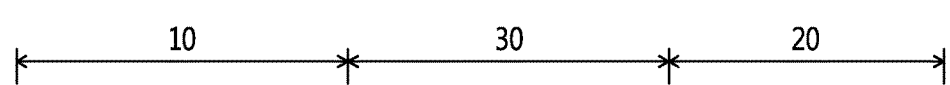
Figure 12:
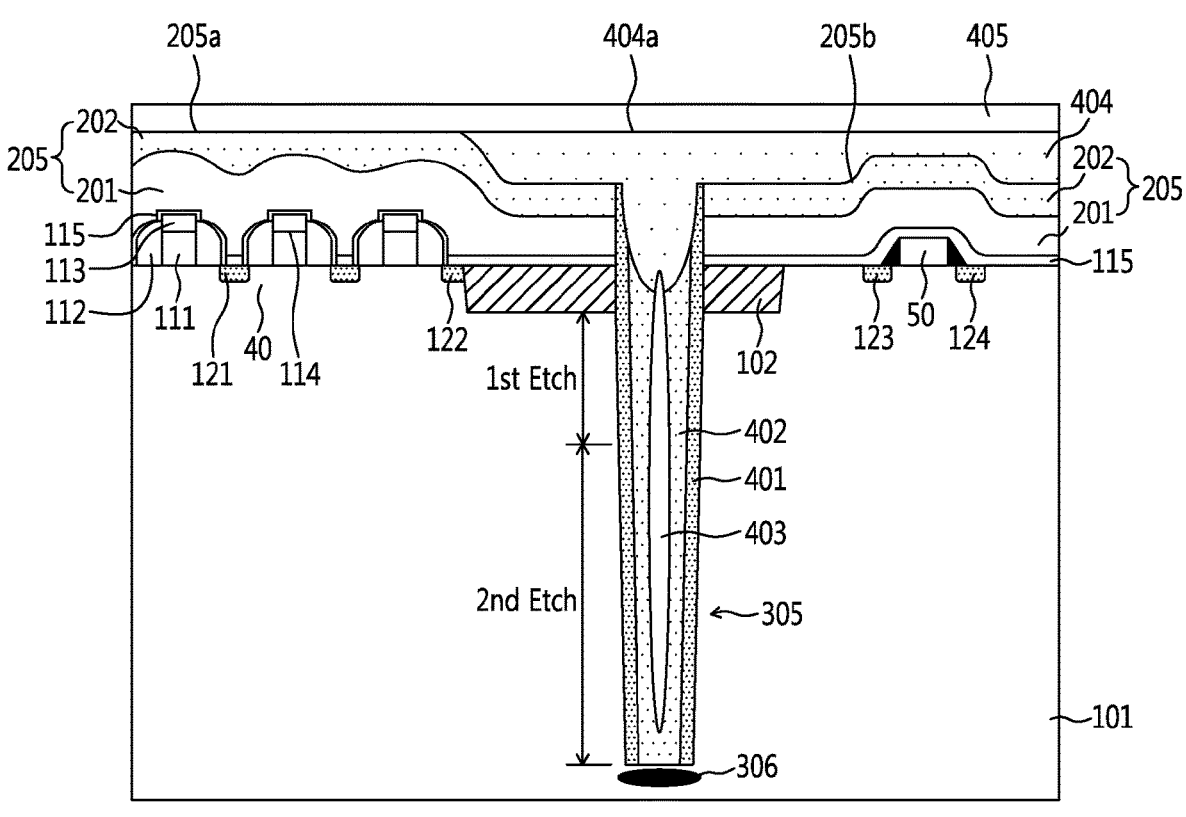

Referring to FIG. 12, a second undoped layer 405 is deposited on the planarized DTI hard mask 205a, and the planarized second DTI gap-fill layer 404a to block an out-diffusion of boron or phosphorus atoms in the planarized second DTI gap-fill layer 404a to another film. The second undoped layer 405 may be deposited with a thickness of 100-305 nm, for example, TEOS film. The second undoped layer 405 may have a higher density than the second DTI gap-fill layer 404.

Figure 13:
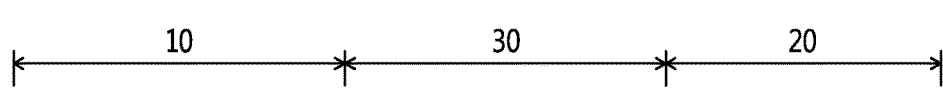
Figure 13:
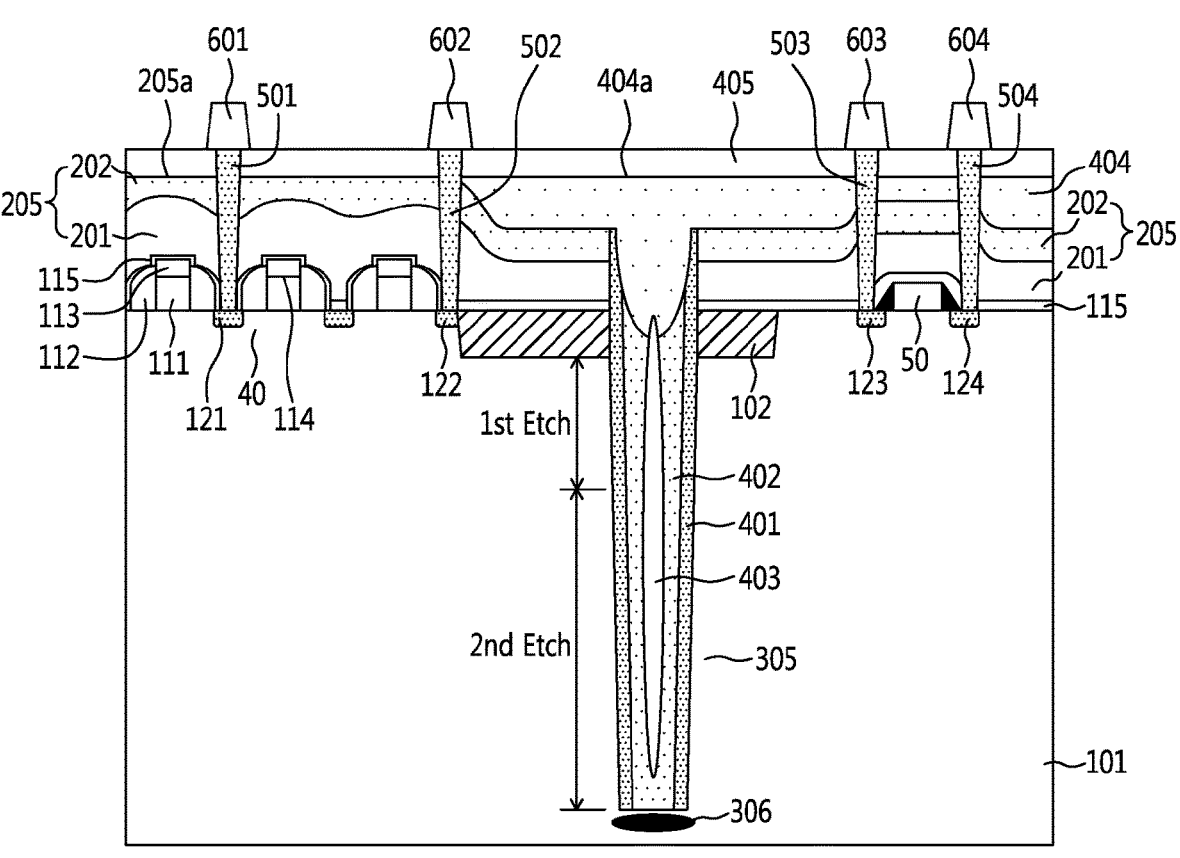

Referring to FIG. 13, a process of forming a contact plug and a metal wiring is performed. Thus, by the contact plug forming process, a first contact plug 501 and a second contact plug 502 may be electrically connected to the source or drain region 121, 122 formed in the first region 10. A third contact plug 503 and a fourth contact plug 504 may be electrically contacted to the source region 123 and the drain region 124, respectively, disposed in the second region 20. The first and second contact plugs 501 and 502 may be formed by passing through the DTI hard mask 205 and the second undoped layer 405. However, the third and fourth contact plugs 503 and 504 may be formed by passing through the DTI hard mask 205, the second DTI gap-fill layer 404, and the second undoped layer 405. Although the second DTI gap-fill layer 404 does not exist in the first region 10, the second DTI gap-fill layer 404 remains in the second region. The stacked insulating layers in which the first to fourth contact plugs 501 to 504 penetrate may differ.

A first metal wiring 601, a second metal wiring 602, a third metal wiring 603, and a fourth metal wiring 604 are formed to be connected to the first to fourth contact plugs 501 to 504, respectively.

As described herein, in one or more examples, a semiconductor device in which a deep trench structure is formed between a non-volatile memory device and a logic device, and efficiently filled with an insulating layer may be produced.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A manufacturing method for a semiconductor device, comprising:
    forming a first gate structure and a second gate structure in a first region and a second region, respectively, on a substrate;
    forming a deep trench isolation (DTI) hard mask on the first and second gate structures;
    forming a deep trench isolation disposed between the first gate structure and the second gate structure using the DTI hard mask;
    depositing a first undoped oxide layer in the deep trench isolation;
    performing a first etch-back process on the first undoped oxide layer to remove a portion of the undoped oxide layer;
    depositing a first deep trench isolation (DTI) gap-fill layer on a remaining portion of the undoped oxide layer, and performing a second etch-back process on the first DTI gap-fill layer;
    depositing a second DTI gap-fill layer to seal the deep trench isolation, and forming a planarized second DTI gap-fill layer by a planarization process, wherein the second DTI gap-fill layer overlaps the second gate structure but does not overlap the first gate structure, and the first DTI gap-fill layer and the second DTI gap-fill layer are formed of a BPSG-based oxide layer; and
    depositing a second undoped layer on the planarized second DTI gap-fill layer.

2. The manufacturing method of claim 1, wherein the first DTI gap-fill layer and at least a portion of the planarized second DTI gap-fill layer are disposed within the deep trench isolation.

3. The manufacturing method of claim 1, wherein an uppermost surface of the second DTI gap-fill layer and an uppermost surface of the DTI hard mask are coplanar with each other after the planarization process.

4. The manufacturing method of claim 1, wherein the second undoped layer is in contact with the second DTI gap-fill layer and the DTI hard mask.

5. The manufacturing method of claim 1, wherein the first DTI gap-fill layer comprises a void.

6. The manufacturing method of claim 1, further comprising:

forming a first contact plug and a second contact plug in the first region and the second region, respectively; and forming a first metal wiring and a second metal wiring connected to the first contact plug and the second contact plug, respectively, wherein the first contact plug is formed passing through the second undoped layer and the DTI hard mask, and wherein the second contact plug is formed passing through the second undoped layer, the DTI hard mask and the second DTI gap-fill layer.

7. The manufacturing method of claim 1, wherein a height of the first gate structure is greater than a height of the second gate structure, and wherein the deep trench isolation is formed passing through a shallow trench isolation.

8. The manufacturing method of claim 1, wherein the DTI hard mask includes a first hard mask insulating layer and a second hard mask insulating layer, wherein a Boron Phosphorus Silicate Glass (BPSG)-based oxide layer is implemented for the first hard mask insulating layer, and wherein a Tetra Ethyl Ortho Silicate (TEOS)-based oxide layer is implemented for the second hard mask insulating layer.

9. A manufacturing method for a semiconductor device, comprising:

forming a shallow trench isolation and a plurality of gate structures including a first gate structure and a second gate structure in a first region and a second region, respectively, on a substrate;

depositing a deep trench isolation (DTI) hard mask on the plurality of gate structures;

forming a deep trench isolation in the substrate, using the DTI hard mask, passing through the shallow trench isolation;

forming a first undoped layer in the deep trench isolation;

forming a first DTI gap-fill layer on the first undoped layer;

depositing a second DTI gap-fill layer on the first DTI gap-fill layer to seal the deep trench isolation, wherein the second DTI gap-fill layer overlaps the second gate structure but does not overlap the first gate structure, and the first DTI gap-fill layer and the second DTI gap-fill layer are formed of a BPSG-based oxide layer;

performing a planarization process to the second DTI gap-fill layer and the DTI hard mask to form a planarized second DTI gap-fill layer and a planarized DTI hard mask, such that the planarized second DTI gap-fill layer is coplanar with the planarized DTI hard mask; and depositing a second undoped layer on the planarized second DTI gap-fill layer and the planarized DTI hard mask.

10. The manufacturing method of claim 9, wherein the forming of the first undoped layer inside the deep trench isolation includes depositing and performing a first etch-back process on the first undoped layer, and wherein the forming of the first DTI gap-fill layer on the first undoped layer includes depositing and performing a second etch-back process on the first DTI gap-fill layer.

11. The manufacturing method of claim 9, further comprising:

forming a first contact plug and a second contact plug, wherein the first contact plug is formed passing through the DTI hard mask and the second undoped layer, and wherein the second contact plug is formed passing through the DTI hard mask the second DTI gap-fill layer, and the second undoped layer.

12. A semiconductor device, comprising:

a first gate structure and a second gate structure formed on a substrate;

a deep trench isolation disposed in the substrate between the first gate structure and the second gate structure;

a first undoped oxide layer disposed in the deep trench isolation;

a first deep trench isolation (DTI) gap-fill layer disposed on a portion of the undoped oxide layer;

a deep trench isolation (DTI) hard mask disposed on the first and second gate structures;

a planarized DTI gap-fill layer disposed on the deep trench isolation to seal the deep trench isolation, wherein the planarized DTI gap-fill layer overlaps the second gate structure but does not overlap the first gate structure, and the first DTI gap-fill layer and the planarized DTI gap-fill layer are formed of a BPSG-based oxide layer; and a second undoped layer disposed on the planarized DTI gap-fill layer and a portion of the DTI hard mask.

13. The semiconductor device of claim 12, wherein the first DTI gap-fill layer has a same material as the planarized DTI gap-fill layer.

14. The semiconductor device of claim 12, wherein an uppermost surface of the planarized DTI gap-fill layer and an uppermost surface of the DTI hard mask are coplanar.

15. The semiconductor device of claim 12, wherein the first DTI gap-fill layer comprises a void.

16. The semiconductor device of claim 12, further comprising:

a first contact plug and a second contact plug disposed in different regions of the substrate; and a first metal wiring and a second metal wiring connected to the first contact plug and the second contact plug, respectively, wherein the first contact plug is formed passing through the second undoped layer and the DTI hard mask, and the second contact plug is formed passing through the second undoped layer, the DTI hard mask and the planarized DTI gap-fill layer.

17. The semiconductor device of claim 12, wherein a height of the first gate structure is greater than a height of the second gate structure, and the deep trench isolation is formed passing through a shallow trench isolation.

18. The semiconductor device of claim 12, wherein the DTI hard mask includes a Boron Phosphorus Silicate Glass (BPSG)-based oxide layer and a Tetra Ethyl Ortho Silicate (TEOS)-based oxide layer.

* * * * *